United States Patent [19]

Rittenbach

[11] Patent Number: 4,647,874

[45] Date of Patent: Mar. 3, 1987

[54] DOPPLER SIGNAL PROCESSING CIRCUITRY

[75] Inventor: Otto E. Rittenbach, Neptune, N.J.

[73] Assignee: The United States of America as represented by the Secretary of the Army, Washington, D.C.

[21] Appl. No.: 874,315

[22] Filed: Jun. 9, 1986

Related U.S. Application Data

[63] Continuation of Ser. No. 328,962, Dec. 9, 1981, abandoned.

[51] Int. Cl.⁴ .............................................. H03L 7/10
[52] U.S. Cl. ....................................... 331/11; 342/99; 342/194; 331/25; 331/12
[58] Field of Search ....................... 331/12, 10, 11, 25, 331/34; 343/7 A, 7 PL; 329/122

[56] References Cited

U.S. PATENT DOCUMENTS 3,710,386  1/1973  Darboven et al. .................... 331/12
4,135,191  1/1979  Sawicki ............................... 343/436
4,188,589  2/1980  Brown et al. ......................... 331/12

Primary Examiner—T. H. Tubbesing
Assistant Examiner—John B. Sotomayor
Attorney, Agent, or Firm—Sheldon Kanars; Jeremiah G. Murray; Edward Goldberg

[57] ABSTRACT

Circuitry is disclosed for processing Doppler-shifted radar signals or other noisy signals which fluctuate widely in frequency. The circuitry includes a dual channel discriminator including a voltage controlled oscillator as part of a feedback loop for frequency tracking of said signals. The discriminator further includes a frequency pass circuit in one channel thereof and a frequency stop circuit in the other channel thereof, with the outputs of these circuits applied to a multiplier. The multiplier output controls the frequency of the voltage controlled oscillator. The voltage controlled oscillator output is heterodyned with the input signals to obtain the heterodyned signals for application to the aforementioned two channels of the discriminator.

9 Claims, 10 Drawing Figures

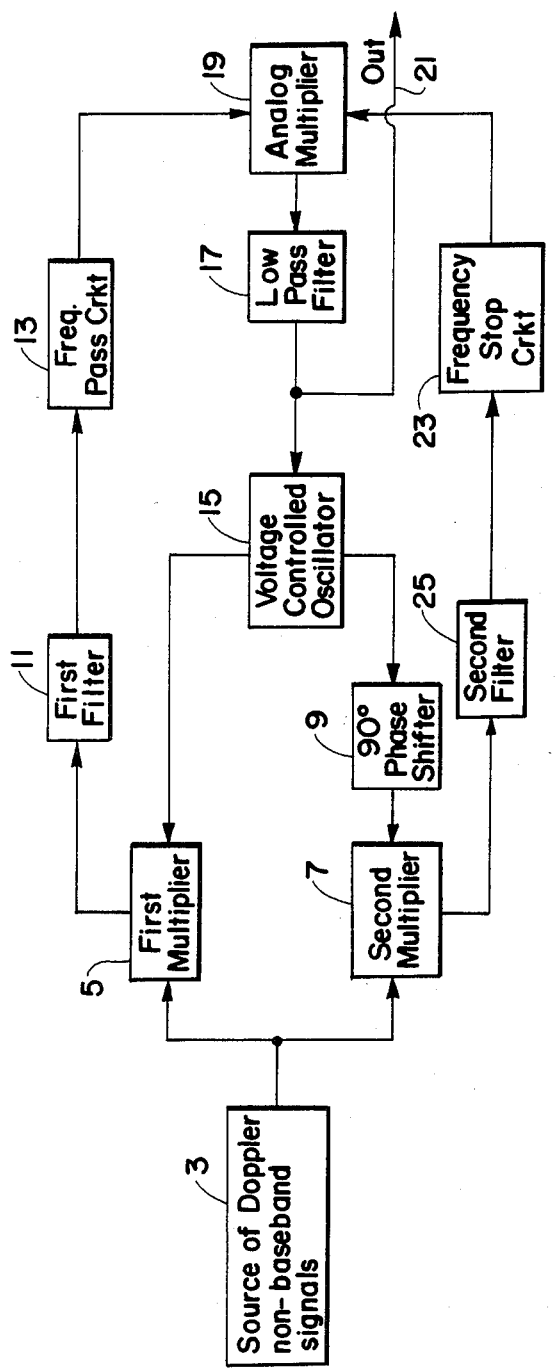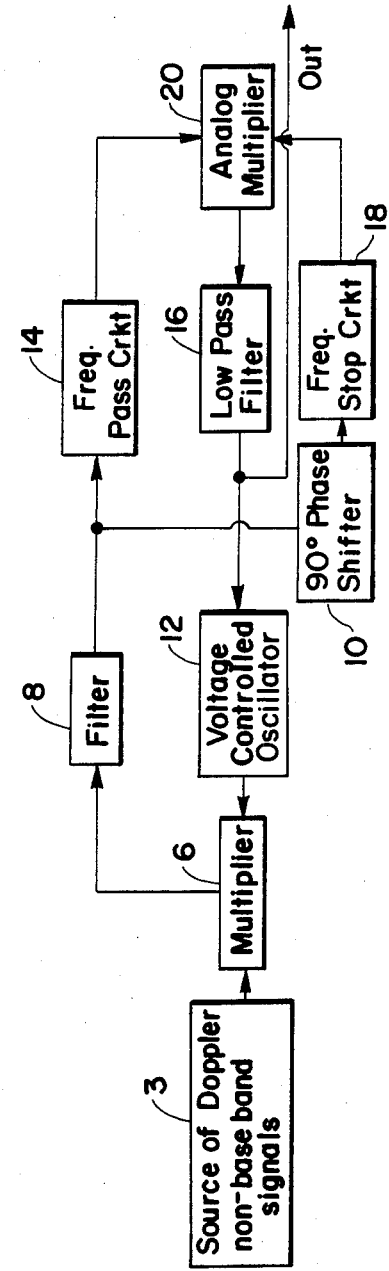

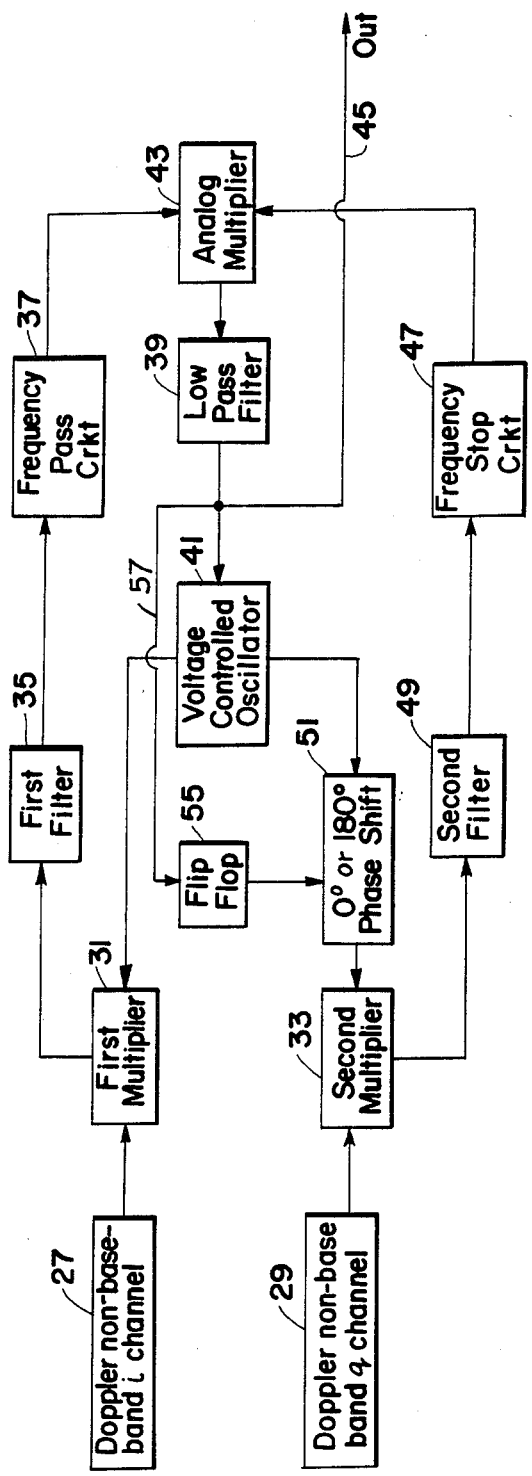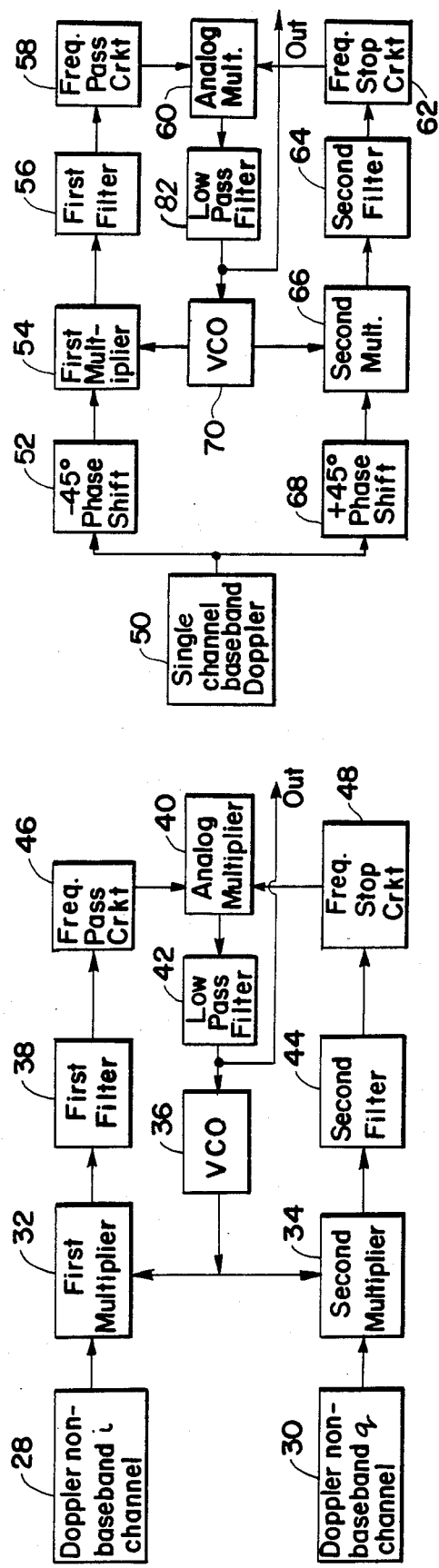
FIG. 3
FIG. 4
FIG. 5

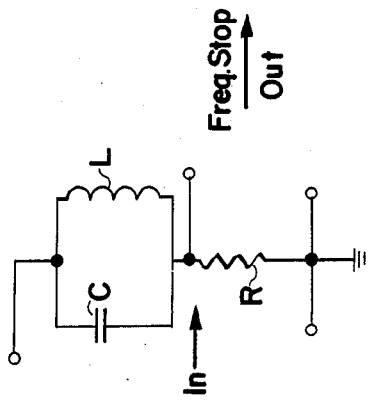
FIG. 10
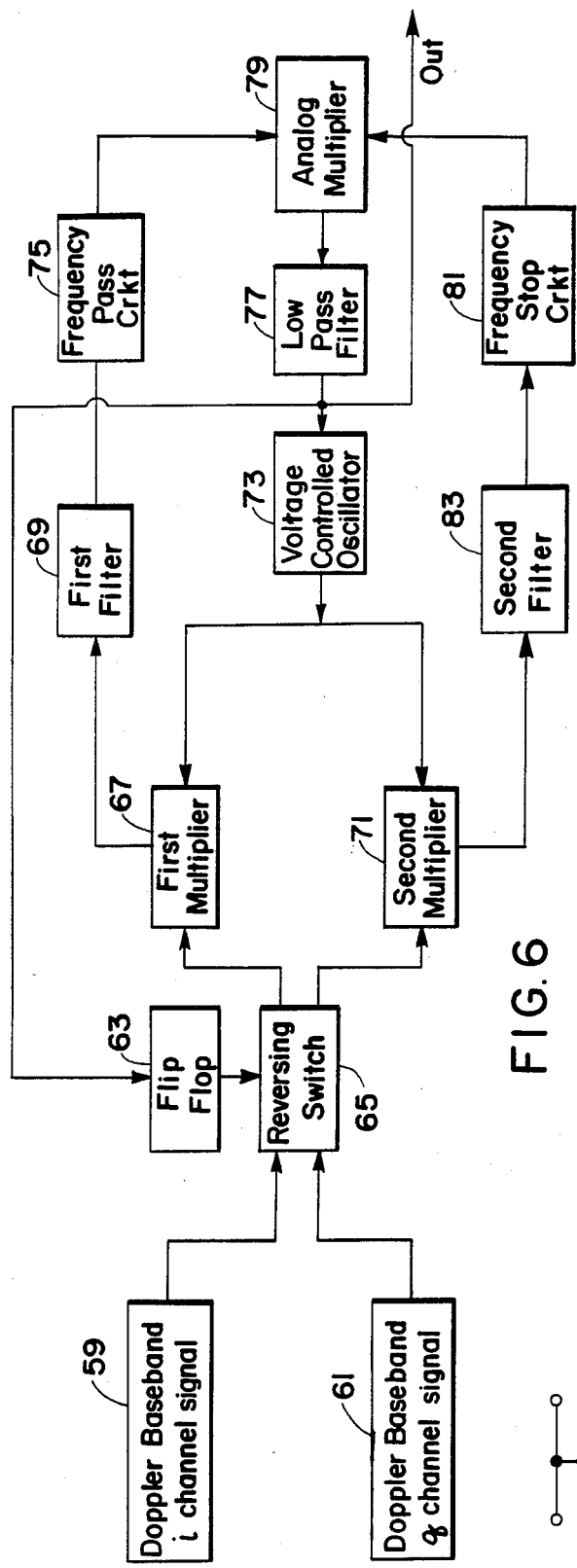
FIG. 6
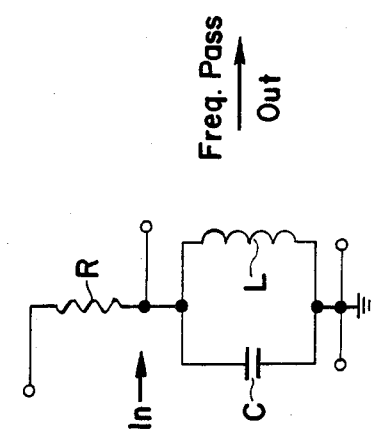
FIG. 9
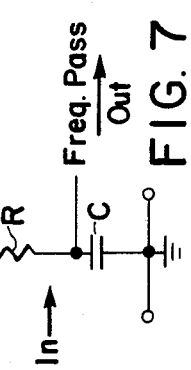
FIG. 7
FIG. 8

1

DOPPLER SIGNAL PROCESSING CIRCUITRY

The invention described herein may be manufactured, used, and licensed by or for the Government for governmental purposes without the payment to me of any royalties thereon.

This application is a continuation of application Ser. No. 328,962, filed Dec. 9, 1981, now abandoned.

BACKGROUND OF THE INVENTION

The field of this invention is, in general, radar circuitry, and more particularly novel circuitry for processing Doppler signals received by radar sets. The circuits of the present invention permits a maximum of information to be obtained from Doppler-shifted echo signals, permits Doppler signals related to incoming and outgoing targets to be preserved and displayed, and it provides a Doppler signal discriminator including a voltage-controlled oscillator which is part of a feedback loop. The feedback feature permits the circuit to continually track a Doppler signal which may be rapidly changing its frequency. The circuits utilize novel dual channel frequency measuring circuitry as part of the feedback type discriminator. Circuits are shown for processing different types of Doppler signals characteristic of different types of radar sets.

SUMMARY OF THE INVENTION

Six embodiments of the invention are shown, each adapted to process different types of Doppler signals, for example, single or dual channel baseband Doppler signals, and single or dual channel non-baseband Doppler signals. All embodiments include a voltage controlled oscillator (VCO), the output of which is applied to one or two multipliers (or mixers). The VCO output may be phase shifted before it is applied to one of the multipliers. The other input of each of the multipliers is one of the Doppler signals to be processed. In the case of the single-channel non-baseband Doppler processor, the single Doppler signal is applied in parallel to one input of both multipliers. In the case of the dual-channel processors, each of the dual-channel Doppler signals is applied to a different one of the multipliers. In the case of the single channel baseband processor, the single-channel Doppler signals are differentially phase shifted by means of plus and minus 45° phase shifter, the outputs of which are applied to two multipliers.

Two different dual channel non-baseband processors are shown for use in radars of the pulse type and non-pulse or CW type.

The processor for use with single channel, non-baseband Doppler signals utilizes only a single multiplier and filter, with a 90° phase shifter utilized to preserve Doppler information relating to the direction of target movement along the radar beam. The heterodyned signals in the outputs of the multipliers contain Doppler information in quadrature relationship, due either to the phase differences in the two applied Doppler signals, or as a result of the aforementioned phase shifted VCO signal applied to one of the multipliers, or as a result of the aforementioned 90° phase shifter. One of these heterodyned signals is applied to a frequency pass circuit which may comprise a parallel resonant circuit tuned to the center frequency of the heterodyned signal, or to a resistor-capacitor (RC) circuit. The other heterodyned signal is applied to a frequency stop circuit which may comprise a resonant trap tuned to the center frequency of the heterodyned signal or to another type of RC circuit. The outputs of the frequency pass and stop circuits are applied to an analog multiplier. The analog multiplier output is applied to a low pass filter which blocks most of the baseband Doppler-frequency signals, but yields a dc bias proportional to the Doppler shift and hence to the radial target velocity. This dc bias forms the output of the processor and is also fed back to the control input of the aforementioned VCO. The circuit thus functions as a discriminator. The use of the VCO in the circuitry described means that the circuit will continually retune itself to track the predominant incoming Doppler signal. Thus the circuit is a form of dual channel feedback discriminator. The circuits for processing baseband Doppler signals comprise a wideband feedback discriminator because of the wide frequency range of such Doppler signals.

It is thus an object of the invention to provide improved and novel signal processing circuitry, adapted to process Doppler and other signals.

Another object of the invention is to provide a feedback discriminator capable of efficiently processing Doppler-shifted signals having a wide range of frequencies.

These and other objects and advantages of the invention will become apparent from the drawings and the following detailed description.

BRIEF DESCRIPTION OF THE DRAWINGS

FIGS. 1 and 2 are block diagrams of processors adapted to process single-channel, non-baseband Doppler signals.

FIG. 3 shows the circuitry of a processor adapted to process dual-channel non-baseband Doppler signals.

FIG. 4 is a circuit for processing dual-channel, non-baseband signals in another type of radar set.

FIG. 5 is a processor adapted to process signal-channel, baseband Doppler signals, and FIG. 6 shows circuitry for processing dual-channel baseband signals.

FIGS. 7–10 show details of frequency stop and frequency pass circuits which may be employed in the circuits of FIGS. 1–3.

DETAILED DESCRIPTION OF PREFERRED EMBODIMENTS

The circuits of FIGS. 1 and 2 are intended for use in a radar receiver which has a single source of Doppler, non-baseband signals, indicated by the block labelled 3 in both FIGURES. Such a Doppler signal may comprise, for example, a received Doppler-shifted echo signal at the RF or transmitted frequency (plus or minus the Doppler shift), or such a signal which has been heterodyned to an intermediate frequency. In the circuit of FIG. 1, this Doppler signal is applied in parallel to one input of a pair of multipliers (or mixers), labelled as first multiplier 5 and second multiplier 7. The second input of the first multiplier 5 is the output of voltage controlled oscillator (VCO) 15 and the second input of second multiplier 7 is the same VCO output which has been phase shifted by 90° in phase shifter 9. The first multiplier has its output connected to first filter 11 and the second multiplier has its output connected to second filter 25. These filters select one of the heterodyne signals in the outputs of the multipliers, for example, the sum or difference of the multiplier signal inputs. The difference signal is the preferred one, since this makes it easier to reject undesired frequencies. The signals at the outputs of the two filters 11 and 25 will have a quadrature relationship due to the phase shifter 9.

The output of the first filter is applied to frequency pass circuit 13. If the first filter output comprises a non-baseband signal, Doppler-shifted by target movement, then circuit 13 would comprise a parallel resonant filter circuit such as that of FIG. 9, tuned to the nominal output frequency of the signal applied thereto from first filter 11. If the first filter output is a signal at Doppler baseband, then the frequency pass circuit 13 can be a simpler RC circuit such as that shown in FIG. 7. The output of the second filter 25 is applied to the frequency stop circuit 23. If the second filter output is a non-baseband signal, Doppler shifted by target movement, the frequency stop circuit will take the form of a tuned trap, such as that of FIG. 10, again tuned to the nominal output frequency of the signal applied thereto. If the output of the second filter is at Doppler baseband, then the frequency stop circuit can be an RC circuit such as is shown in FIG. 8. The outputs of the frequency stop and pass circuits from the inputs of analog multiplier 19. The output of multiplier 19, which is the product of the outputs of circuits 13 and 23, is applied to low pass filter 17. The output of filter 17 comprises the processor output, 21, and is also applied to the control input of voltage controlled oscillator 15, to control the frequency therof.

The frequency pass and stop circuits together with the analog multiplier and low pass filter form a frequency discriminator, similar to that described and claimed in a co-pending application of the present inventor entitled FREQUENCY DISCRIMINATOR, Ser. No.: 296,026, filed Aug. 25, 1981 and now issued as U.S. Pat. No. 4,426,622 on Jan. 17, 1984. Since the signals at the inputs of the frequency pass and stop circuits are in quadrature, no phase shifters such as those shown in the aforementioned application are required.

The output signal at 21 will comprise a dc bias proportional to the radial velocity of the predominant moving target in the radar beam. Thus this output dc bias is indicative of the radial velocity of the predominant moving target. If the cutoff frequency of the low pass filter 17 is properly selected, the output signal at 21 can be made to fluctuate with the step frequency characteristic of moving human targets, as explained in another co-pending application of the present inventor entitled, DOPPLER FREQUENCY ANALYSIS OF RADAR SIGNALS, Ser. No.: 271,725, filed June 8, 1981 and now issued as U.S. Pat. No. 4,400,700 on Aug. 23, 1983. As explained in that application, the Doppler signature of a walking human target comprises a main body return, the frequency of which is determined by the target's radial velocity, modulated by an almost invariably lower step frequency caused by oscillatory arm, leg and torso movements. If the low pass filter 17 of FIG. 1 herein has a cutoff frequency lower than the lowest expected main body Doppler return but higher than the highest expected step frequency return, the output 21 will comprise a dc component proportional to said main body return frequency, modulated by the step frequency. Thus the circuit of FIG. 1 as well as all other processors disclosed herein can be used as an FM detector in place of the detector shown in FIG. 3 of the last-mentioned co-pending application, Ser. No.: 271,725.

In the processor of FIG. 2, only a single multiplier 6 is utilized with a single filter 8 connected to the output thereof to select the desired heterodyne frequency. The output of the filter is directly connected to frequency pass circuit 14 and the filter output is phase shifted by 90° in circuit 10 before it is applied to frequency stop circuit 18. The remainder of the circuitry is the same as the similarly designated circuits of FIG. 1, and the frequency pass and stop circuits are either tuned circuits or RC circuits depending on the frequency selected by filter 8, as in the embodiment of FIG. 1.

FIG. 3 shows a version of the novel Doppler signal processor which can be utilized in a radar receiver which includes a pair of quadrature Doppler signal non-baseband channels, referred to as i and q channels. Such a radar may be a pulse Doppler radar in which the Doppler information appears in both sidebands of the pulse repetition frequency and hence the two quadrature related i and q channels are necessary if Doppler information regarding both incoming and outgoing targets is to be preserved. Such Doppler non-baseband signals would usually have as their nominal frequency the receiver's intermediate frequency, however they could comprise the RF echo signal unchanged in frequency except for the Doppler modulation thereon. In FIG. 3 the two sources of Doppler non-baseband signals are indicated by numerals 27 and 29 and labelled as the i and q channels. The i channel signals are applied to one input of first multiplier 31 and the q channel to one input of second multiplier 33. A first filter 35 is connected to the output of the first multiplier and a second filter 49 to the output of the second multiplier. The second input of the first multiplier is the output of VCO 41 and the second input of the second multiplier 33 is the output of circuit 51, which has as its input the output of VCO 41. Circuit 51 may be either a 180° phase shifter or a zero degree phase shifter depending on the control applied thereto from flip-flop 55. The frequency pass and stop circuits 37 and 47, the analog multiplier 43 and low pass filter 39 perform the same function as do the similarly named components in FIG. 1. Also, as in the previous embodiments, the frequency pass circuit may be a parallel resonant filter circuit as shown in FIG. 9 or an RC circuit like that of FIG. 7, depending on whether the heterodyne signal passed by first filter 35 is a baseband or non-baseband signal. Similarly, the frequency stop circuit may be either a resonant trap like that of FIG. 10, tuned to the nominal, non-baseband output frequency of second filter 49, or it may be a RC circuit like that of FIG. 8, if the filter 49 is tuned to select the baseband Doppler signals from the heterodyne products in the output of second multiplier 33.

The output of low pass filter 39 is the processor output and is also applied to the control input of VCO 41 to control the frequency thereof. The output of filter 39 is also applied to flip-flop 55 to control the state thereof. Flip-flop 55 is a bistable circuit, for example, a Schmitt trigger which will change state depending on the voltage applied thereto over lead 57. The flip-flop is connected to phase shifter 51 as indicated, and in one state of the flip-flop the phase shifter will have a phase shift of 180° and in the other state a phase shift of 0°. The purpose of the switchable phase shifter in the circuit of FIG. 3 is to enable the circuit to process both incoming and outgoing moving targets. If the phase shifter were omitted and both of the multiplier 31 and 33 were directly connected to the output of VCO 41, the circuit would respond only to either incoming or outgoing moving targets. Such a circuit would have some utility, for example, if it responded only to incoming targets, it might be used to detect intruders. However, a circuit which responds to both types of moving targets is more versatile and hence is preferred.

The processor of FIG. 4 includes quadrature i and q channels, and this does not require a 90° phase shifter such as that of FIG. 1. The processor of FIG. 4 is also intended for use with dual channel, non-baseband Doppler signals, in non-pulse radars. Such signals would for example be Doppler-shifted RF or IF signals in a CW radar. The absence of transmitter pulses in such radars simplifies the circuit somewhat compared to that of FIG. 3 in that no switchable phase shifters are required to track both incoming and outgoing targets. In FIG. 4 the two Doppler signal source 28 and 30 comprising the i and q channels are applied as one input to first and second multipliers 32 and 34. The second input of each of these multipliers is the output of VCO 36. The rest of the circuitry is the same as that of all the previously described embodiments.

The circuit of FIG. 5 is intended for processing single channel, baseband Doppler signals, for example Doppler signals which are obtained in a zero IF, CW radar by heterodyning the echo signal with a sample of the transmitter output. The Doppler signals are differentially phase shifted by 90° by applying them in parallel to a minus 45° phase shifter 52 and to a plus 45° phase shifter 68. The outputs of the phase shifters are applied to first and second multipliers 54 and 66. The output of VCO 70 is applied to both the multipliers as the second input of each. The remainder of the circuitry is the same as that of the previous FIGURES. Instead of the two 45° phase shifters, a single 90° phase shifter may be used in this circuit. A single channel baseband Doppler signal has no information therein relating to sense or direction of target motion. In FIG. 5, it is necessary to split the single channel Doppler signals into two quadrature related channels by means of the two phase shifters 52 and 68, so that the dual channel frequency discriminator comprising the frequency pass and stop circuits and the related circuitry may be utilized, to provide wide-band capability, not available in conventional frequency feedback circuits.

The processor of FIG. 6 is intended for use in radar receivers which have a pair of Doppler baseband channels, for example i and q channels representing quadrature baseband Doppler signals which may be obtained by heterodyning a CW echo signal of a zero-intermediate frequency CW radar with a sample of the transmitted signal and also with a phase shifted sample of said transmitted signal. The use of these quadrature related i and q signals makes it possible to separate the incoming and outgoing targets from each other, as in the circuit of FIG. 3. In FIG. 6 the i and q baseband signal sources 59 and 61 are applied as one input of first and second multipliers 67 and 71 through a reversing switch 65, which is controlled by flip-flop 63. Thus in one state of the flip flop, source 59 will be applied to the first multiplier 67 and source 61 to second multiplier 71. In the other state of the flip-flop, the connections will be interchanged with source 59 applied to the second multiplier and source 61 to the first multiplier.

The first filter 69, frequency pass circuit 75, analog multiplier 79, low pass filter 77, second filter 83, the voltgage controlled oscillator 73 and the frequency stop circuit 81 all perform the same functions as the similarly named components in the previously described embodiments of FIGS. 1 and 2. Also, the frequency pass and stop circuits 75 and 81 must be resistor-capacitor circuits because of the broadband nature of the incoming Doppler signals. The output of the VCO 73 is directly connected to both the first and second multipliers 67 and 71 as the second input of each of these circuits. As in FIG. 3, the flip-flop 63 is controlled by the dc bias at the output of low pass filter 77, and the reversal of the inputs to the two multipliers enables the circuit to process both incoming and outgoing moving targets. Assuming that outgoing targets produce a positive dc bias in the output of low pass filter 77, the flip-flop would be arranged to change states when the output approaches zero, indicating that the target bar stopped his radial motion or has reversed direction. The reversal of the reversing switch 65 will then result in positive output bias from filter 77 for targets of the opposite radial direction. The function of the switchable phase shifter 51 of FIG. 3 is similar to the reversing switch of FIG. 6 in that the flip-flop 55 changes state when the low pass filter output approaches zero.

The resistor-capacitor circuit of FIG. 7 comprises the series connected resistor R and capacitor C, with the capacitor grounded. The input is applied across both elements, and the frequency pass output is the voltage across the capacitor. The circuit of FIG. 8 is similar but has the resistor R grounded and the resistor voltage forms the frequency stop output.

The tuned frequency pass circuit of FIG. 9 comprises a resistor R in series with a parallel inductor-capacitor circuit comprising L and C, with the low end of the LC circuit grounded and the input applied across the entire series-parallel circuit. The frequency pass output is the voltage across the parallel LC circuit. The tuned frequency stop circuit of FIG. 10 is similar to that of FIG. 9 except that the series resistor R is grounded and the frequency stop output is the voltage across R.

While the circuits disclosed herein have been described for use in connection with radar-sets, other uses will suggest themselves to those skilled in the art. For example, the circuits can be used to detect any noisy signal which fluctuates over a large frequency range of up to several octaves. Such signals are sometimes encountered in telemetry or communications receivers.

Also, while the invention has been described as using analog circuitry, the equivalent digital circuitry may be substituted therefor. This digital implementation would be useful where the applied Doppler signals are already in digital form.

While the invention has been described in connection with illustrative embodiments, obvious variations therein will be apparent to those skilled in the art, accordingly the invention should be limited only by the scope of the appended claims.

I claim:
1. Signal processing circuitry comprising:
   an input source of Doppler signals including a first given signal frequency containing information related to movement of a target;
   a first multiplier having a first input connected to receive said signal from said source, a second input, and an output including a second signal frequency;
   a voltage controlled oscillator having an input and an output, said output having a third frequency connected to said second input of said first multiplier;
   a first frequency selective filter having an input and an output, and input being connected to said first multiplier output and selecting said second signal frequency therefrom;

a frequency pass circuit having an input and an output, said input being connected to the output of said first filter to pass said second signal frequency;

an analog multiplier having a first input connected to the output of said frequency pass circuit and having a second input and an output;

a frequency stop circuit having an input and an output, said output being connected to said second input of said analog multiplier, said frequency pass and stop circuits being tuned to the same frequency;

means for applying a quadrature phase shifted signal of said second frequency to the input of said frequency stop circuit so that the inputs of said frequency stop and pass circuits are 90° out of phase, the response characteristics of said frequency stop and pass circuits being such that the output of said frequency stop circuit is of opposite phase with respect to said frequency pass circuit output below resonance and the outputs from said frequency stop and pass circuits are of the same phase above resonance; and a low pass filter having an input and an output, said input being connected to said output of said analog multiplier, and said output being a direct voltage connected to said input of said voltage controlled oscillator to control said third frequency and providing an output signal proportional to target velocity for said processing circuit, said frequency pass and stop circuits and analog multiplier and low pass filter providing a frequency discriminator.

2. The circuitry of claim 1 wherein said frequency pass circuit comprises a tuned filter and said frequency stop circuit comprises a tuned trap, both tuned to the same frequency.

3. The circuit of claim 1 wherein said frequency pass circuit comprises a series connected resistor-capacitor with the capacitor grounded and said frequency stop circuit comprises a series-connected resistor-capacitor circuit with the resistor grounded.

4. The signal processing circuitry of claim 1 wherein said means for applying a quadrature phase shifted signal includes a third multiplier having a first input connected to receive said signal from said source, a second input, and an output including said second frequency; said voltage controlled oscillator including a second output; a 90° phase shifter having an input connected to said second output of said oscillator and an output connected to said second input of said third multiplier; a second frequency selective filter having an input connected to said output of said third multiplier and an output selecting said second frequency phase shifted by 90°, said second frequency selective filter output being connected to the input of said frequency stop circuit.

5. The signal processing circuit of claim 1 wherein said means for applying a quadrature phase shifted signal includes a 90° phase shifter having an input connected to the output of said first frequency selective filter and an output connected to the input of said frequency stop circuit.

6. The signal processing circuitry of claim 1 wherein said source includes first and second channels of said first frequency, said second channel having said first frequency phase shifted by 90°, said means for applying said quadrature phase shifted signal including a third multiplier having a first input connected to receive said first phase shifted frequency, a second input, and an output including said second frequency phase shifted by 90°; said voltage controlled oscillator including a second output connected to said second input of said third multiplier, a second frequency selective filter having an input connected to said output of said third multiplier and an output selecting said phase shifted second frequency connected to the input of said frequency stop circuit.

7. The signal processing circuitry of claim 1 wherein said means for applying a quadrature phase shifted signal includes a third multiplier having a first input, a second input, and an output including said second frequency; a first −45° phase shifter connected between said first multiplier first input and said input signal source; a second +45° phase shifter connected between said first input of said third multiplier and said input signal source; said voltage controlled oscillator including a second output connected to said second input of said third multiplier; a second frequency selective filter having an input connected to said third multiplier output and an output selecting said second frequency phase shifted by +45°, the output of said first frequency selective filter being phase shifted by −45°, said output of second filter being connected to the input of said frequency stop circuit.

8. The circuitry of claim 6, wherein said first and second channels comprise dual-channel i and q nonbaseband Doppler signals and wherein said first inputs of said first and third multipliers are connected respectively to said i and q channels and a 0° or 180° switchable phase shifter is connected between the second output of said voltage controlled oscillator and the second input of said third multiplier, a flip-flop having an output connected to control the phase shift of said switchable phase shifter and an input connected to the output of said low pass filter.

9. The circuitry of claim 6 wherein said first and second channels comprise dual channel baseband i and q Doppler signals, means to apply said i and q channels to the first inputs of said first and third multipliers via a reversing switch adapted to interchange the i and q channels to each of said first and third multipliers, and a flip-flop arranged to control the state of said reversing switch, the state of said flip-flop being controlled by the same voltage which is applied to the input of said voltage controlled oscillator.

* * * * *